United States Patent
Abhinand et al.

(10) Patent No.: US 11,600,492 B2
(45) Date of Patent: Mar. 7, 2023

(54) ELECTROSTATIC CHUCK WITH REDUCED CURRENT LEAKAGE FOR HYBRID LASER SCRIBING AND PLASMA ETCH WAFER SINGULATION PROCESS

(71) Applicant: Applied Materials, Inc., Santa Clara, CA (US)

(72) Inventors: Sai Abhinand, Singapore (SG); Michael Sorensen, Milpitas, CA (US); Karthik Elumalai, Karnataka (IN); Dimantha Rajapaksa, Ragama (LK); Cheng Sun, Singapore (SG); James S. Papanu, San Rafael, CA (US); Gaurav Mehta, Singapore (SG); Eng Sheng Peh, Singapore (SG); Sri Thirunavukarasu, Singapore (SG); Onkara Korasiddaramaiah, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 579 days.

(21) Appl. No.: 16/709,522

(22) Filed: Dec. 10, 2019

(65) Prior Publication Data
US 2021/0175086 A1    Jun. 10, 2021

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32642* (2013.01); *H01J 37/32715* (2013.01);
(Continued)

(58) Field of Classification Search
CPC ......... H01L 21/68714; H01L 21/68735; H01L 21/68742; H01L 21/3065; H01L 21/6833;
(Continued)

(56) References Cited

U.S. PATENT DOCUMENTS 4,049,944 A    9/1977 Garvin et al.
4,339,528 A    7/1982 Goldman
(Continued)

FOREIGN PATENT DOCUMENTS

JP    9216085    8/1997
JP    H 09-232415    9/1997
(Continued)

OTHER PUBLICATIONS

Linder, V. et al., "Water-Soluble Sacrificial Layers for Surface Micromachining," www.small-journal.com, 2005, 1, No. 7, 7 pgs.
(Continued)

*Primary Examiner* — Ermias T Woldegeorgis
(74) *Attorney, Agent, or Firm* — Schwabe, Williamson & Wyatt, P.C.

(57) ABSTRACT

Electrostatic chucks with reduced current leakage and methods of dicing semiconductor wafers are described. In an example, an etch apparatus includes a chamber, and a plasma source within or coupled to the chamber. An electrostatic chuck is within the chamber. The electrostatic chuck includes a conductive pedestal having a plurality of notches at a circumferential edge thereof. The electrostatic chuck also includes a plurality of lift pins corresponding to ones of the plurality of notches.

20 Claims, 15 Drawing Sheets

(51) Int. Cl.
*H01L 21/683* (2006.01)
*H01L 21/82* (2006.01)

(52) U.S. Cl.
CPC .......... *H01L 21/6833* (2013.01); *H01L 21/82* (2013.01); *H01J 2237/3341* (2013.01)

(58) Field of Classification Search
CPC ..... H01L 21/82; H01L 21/6831; H01L 21/78; H01L 21/67092; H01L 21/67069; H01L 21/67207; H01L 21/68757; H01J 37/32642; H01J 37/32715; H01J 2237/3341; B23K 26/53
See application file for complete search history.

(56) References Cited

U.S. PATENT DOCUMENTS

| | | | |
|---|---|---|---|
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 9,034,771 B1 * | 5/2015 | Nangoy ............ H01L 21/67207 438/710 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0216313 A1 | 8/2010 | Iwai et al. |
| 2010/0248451 A1 | 9/2010 | Pirogovsky et al. |
| 2011/0014777 A1 | 1/2011 | Haji et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0122431 A1 | 5/2013 | Angelov et al. |
| 2013/0230972 A1 | 9/2013 | Johnson et al. |
| 2018/0158717 A1 * | 6/2018 | Hanzlik ............ H01L 21/68742 |

FOREIGN PATENT DOCUMENTS

| | | |
|---|---|---|
| JP | 10321908 | 12/1998 |
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2013-153171 | 8/2013 |
| KR | 10-0903014 | 6/2009 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.
International Search Report and Written Opinion from PCT Patent Application No. PCT/US2020/062745 dated Mar. 22, 2021, 11 pgs.
International Preliminary Report on Patentability from Patent Application No. PCT/US2020/062745 dated Jun. 23, 2022, 7 pgs.

* cited by examiner

ELECTROSTATIC CHUCK WITH REDUCED CURRENT LEAKAGE FOR HYBRID LASER SCRIBING AND PLASMA ETCH WAFER SINGULATION PROCESS

BACKGROUND

1) Field

Embodiments of the present disclosure pertain to the field of semiconductor processing and, in particular, to apparatuses for and methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximately 15 to 60 microns thick. As such, to insure that cracking and other damage surrounding the cut made by the saw does not harm the integrated circuits, from 60 to three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma etching of commonly encountered metals (e.g., copper) in dicing along streets can create production issues or throughput limits.

SUMMARY

Embodiments of the present disclosure include methods of, and apparatuses for, dicing semiconductor wafers.

In an embodiment, an etch apparatus includes a chamber, and a plasma source within or coupled to the chamber. An electrostatic chuck is within the chamber. The electrostatic chuck includes a conductive pedestal having a plurality of notches at a circumferential edge thereof. The electrostatic chuck also includes a plurality of lift pins corresponding to ones of the plurality of notches.

In another embodiment, a method of dicing a semiconductor wafer having a plurality of integrated circuits includes forming a mask above the semiconductor wafer, the mask being or including a layer covering and protecting the integrated circuits, and the semiconductor wafer supported by a substrate carrier. The method also involves patterning the mask with a laser scribing process to provide a patterned mask with gaps, exposing regions of the semiconductor wafer between the integrated circuits. The method also involves etching the semiconductor wafer through the gaps in the patterned mask to singulate the integrated circuits while the semiconductor wafer is supported by the substrate carrier, and the substrate carrier is supported by an electrostatic chuck having a conductive pedestal having a plurality of notches at a circumferential edge thereof.

In another embodiment, a system for dicing a semiconductor wafer having a plurality of integrated circuits includes a factory interface. A laser scribe apparatus is coupled with the factory interface and includes a laser. An etch apparatus is coupled with the factory interface, the etch apparatus including a chamber, a plasma source within or coupled to the chamber, and an electrostatic chuck within the chamber. The electrostatic chuck includes a conductive pedestal having a plurality of notches at a circumferential edge thereof, and a plurality of lift pins corresponding to ones of the plurality of notches.

DETAILED DESCRIPTION

Figure 1A:
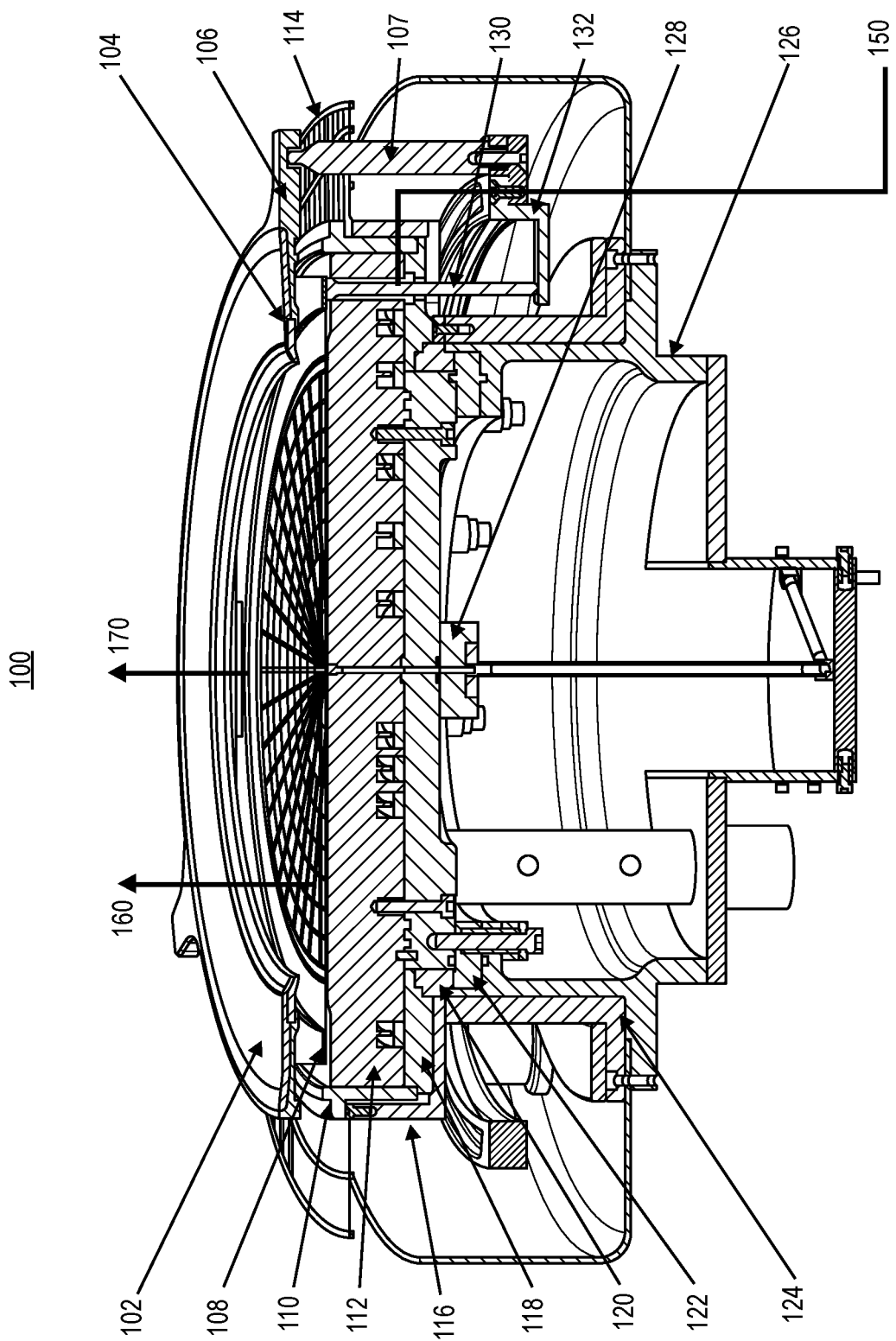
FIG. 1A illustrates an angled cross-sectional view of an electrostatic chuck, in accordance with an embodiment of the present disclosure.

Methods of, and apparatuses for, dicing semiconductor wafers are described. In the following description, numerous specific details are set forth, such as electrostatic chuck configurations, laser scribing conditions, and plasma etching conditions and material regimes, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed particularly to electrostatic chuck (ESC) designs to reduce leakage current for a plasma dicing etch chamber. Embodiments may be suitable for accommodating a substrate carrier with an ESC that includes lift pins arranged at a greater diameter of the ESC than for a typical substrate processing ESC. Embodiments may be applicable to laser and etch wafer dicing approaches and tooling for singulation or dicing of electronic device wafers.

To provide context, an electrostatic chuck in a plasma dicing etch chamber may be a source of or associated with a high leakage current. The result may be detrimental to processing window in terms of wafer chucking efficacy, implementation of "break through" operations and chuck lifetime. One or more embodiments described herein may be implemented to mitigate such a leakage current issue to improve process margin. In particular, some embodiments pertain to identifying a metallic region of a cathode that can directly be exposed to plasma and eventually cause arcing/ESC current leakage. Upon identification of such locations, the locations are modified to enable coating with an insulator such as alumina. In a particular embodiment, in order to operate a lift mechanism normally, an ESC conductive pedestal is modified to include lift pin notches in place of lift pin holes. In another particular embodiment, in order to operate a lift mechanism normally, an ESC edge insulator ring is modified to include lift pin holes.

Other approaches to addressing the above issues may include separating an ESC voltage surface from an RF cathode surface. By doing this, the exposed metal (to the plasma inside the chamber) would only short the RF power source to plasma but not the ESC voltage. However, one or more embodiments described herein may be implemented to prevent both an ESC as well as an RF voltage source from shorting into the plasma. Such embodiments may enable prevention of both DC as well as RF voltages from being shorted into the plasma.

Pertaining to embodiments described in association with FIGS. 1A and 2A-2C below, an electrostatic chuck design may include a thick piece of aluminum (Al) with three holes along its thickness. The holes are included to allow lift pins to go through there through to assist a wafer lift mechanism. The "Al" chuck is spray coated with a dielectric material (such as alumina) all over its body (except for the lift pin holes due to the difficulty of manufacture) to prevent it from arcing when exposed in a plasma chamber and also allow operation as an electrostatic chuck (ESC). When the chuck is situated in a plasma chamber and run, the plasma can arc the "Al" chuck through the lift pin holes producing a steady ESC current that is proportional to ESC voltage. The result may be only marginal chucking capability. It is to be appreciated that ideally the ESC current should be zero, and in practice it should be several to 10's of microamps. If current levels become higher such as hundreds of microamps, chucking capability is degraded significantly, resulting in marginal chucking.

Pertaining to embodiments described in association with FIGS. 3A-3C below, an electrostatic chuck design involves separation of a lift pin mechanism from an "Al" chuck by removing three chunks of metal from the Al chuck in locations where the lift pins are to be accommodated. These locations are filled in by the modified ESC edge insulator with ceramic lift pin holes. In this way, the "Al" ESC can be completely spray coated with alumina thereby preventing exposure of any "Al" to plasma which can prevent ESC current from leaking.

To provide further context, during singulation of a wafer into individual die, the wafer is cut or sectioned along dicing streets between the dies. Traditionally, dicing has been performed with a mechanical saw. Mobile devices and other technology drivers may require more advanced singulation approaches to reduce cracking, delamination, and chipping defects. A laser and etch wafer dicing approach may involve applying a water soluble protective coating to a substrate, removing the coating any device test layers in the street regions removed by laser scribing to open up the underlying substrate material, which is typically silicon (Si). The exposed Si is then plasma etched through its entire thickness to singulate the wafer into the individual die. The protective coating is removed in a deionized (DI) water based cleaning operation. Water soluble protective coatings may be desirable due to environmental considerations and ease of processing. Such a water soluble coating may primarily be used as an etch mask during the plasma etching step, and also as a layer that collects any debris generated during laser scribing.

To provide yet further context, femtosecond lasers may be preferred in the laser scribing portion of the process. Unlike nanosecond and other long pulse lasers, femtosecond lasers have little heat effect because of the associated ultra-short pulses. Another advantage of femtosecond lasers may be the capability to remove most materials including absorptive, reflective and transparent materials. On typical wafers, there are metals which are reflective and absorptive, the dielectrics which are transparent, and the silicon substrate which is absorptive to most laser light. The water-soluble protective coating is totally or mostly transparent, or can be partially absorbing, e.g., if including a dye additive. These listed materials can be ablated by femtosecond lasers.

It is to be appreciated that although many embodiments described below are associated with femto-second laser scribing, in other embodiments, laser scribing with other laser beam types may also be compatible with masking materials described herein. It is also to be appreciated that although many embodiments described below are associated with scribing streets having metallized features, in other embodiments, metal free scribing streets may also be considered. It is also to be appreciated that although many embodiments described below are associated with water soluble dicing masks, in other embodiments, other mask materials may also be considered.

FIG. 1A illustrates an angled cross-sectional view of an electrostatic chuck, in accordance with an embodiment of the present disclosure.

Referring to FIG. 1A, an electrostatic chuck assembly 100 includes a shadow ring or heat shield 102 and associated shadow ring insert 104 and shadow ring carrier 106. In one embodiment, all of the shadow ring or heat shield 102, shadow ring insert 104 and shadow ring carrier 106 are composed of a ceramic material such as alumina. A substrate on the substrate carrier may be included beneath the shadow ring, and a tape frame 108 of a substrate carrier may be included beneath the heat shield, as is depicted in FIG. 1A. The tape frame 108 may be composed of stainless steel. An adjustable lift pin 107 is included for lifting the shadow ring, and may be composed of aluminum.

The electrostatic chuck assembly 100 further includes an edge insulator ring 110 around a conductive pedestal 112. A bottom insulator ring 118 is beneath the conductive pedestal 112. The edge insulator ring 110 and the bottom insulator ring 118 may be composed of a ceramic material such as alumina, and the conductive pedestal 112 may be composed of aluminum. The conductive pedestal 112 may be electrically coupled to ground and/or to a DC voltage.

The electrostatic chuck assembly 100 further includes a plasma screen segment 114 and a plasma screen basket 116, both of which may be composed of aluminum. The electrostatic chuck assembly 100 further includes a cathode insulator 120, a facilities insulator 122, and a cathode liner 124. The cathode insulator 120 may be composed of silicon dioxide, and the cathode liner 124 may be composed of aluminum. The electrostatic chuck assembly 100 further includes a support pedestal 126 and a gas feedthrough 128, such as a helium feedthrough.

A lift pin 130 and lift pin finger 132 are included in the electrostatic chuck assembly 100. The lift pin 130 may be composed of alumina, and the lift pin finger 132 may be composed of aluminum. It is to be appreciated that a plurality of such lift pins 130 may be included in the electrostatic chuck assembly 100. In an embodiment, such a plurality of lift pins 130 is located outside of a perimeter of a processing region of the conductive pedestal 112. In one such embodiment, the plurality of lift pins 130 is arranged for contacting a tape frame 108 of a substrate carrier.

In an embodiment, an exposed surface 160 and a covered surface 170 of the conductive pedestal 112 are coated with a ceramic material, such as alumina. In an embodiment, each lift pin 130 is included in an opening 150. In one such embodiment, opening 150 is a hole included in conductive pedestal 112, as is depicted in FIG. 1A and described in greater detail below in association with FIGS. 2A-2C. The hole may not be coated with a ceramic material and may be a location susceptible to current leakage from the electrostatic chuck assembly. In another such embodiment, opening 150 is a notch included at a circumferential edge a conductive pedestal, as is described in greater detail below in association with FIGS. 3A-3C. The notches of the embodiment of FIGS. 3A-3C may be coated with a ceramic material and may mitigate current leakage from the electrostatic chuck assembly relative to the holes of the embodiment of FIGS. 2A-2C.

Figure 2A:
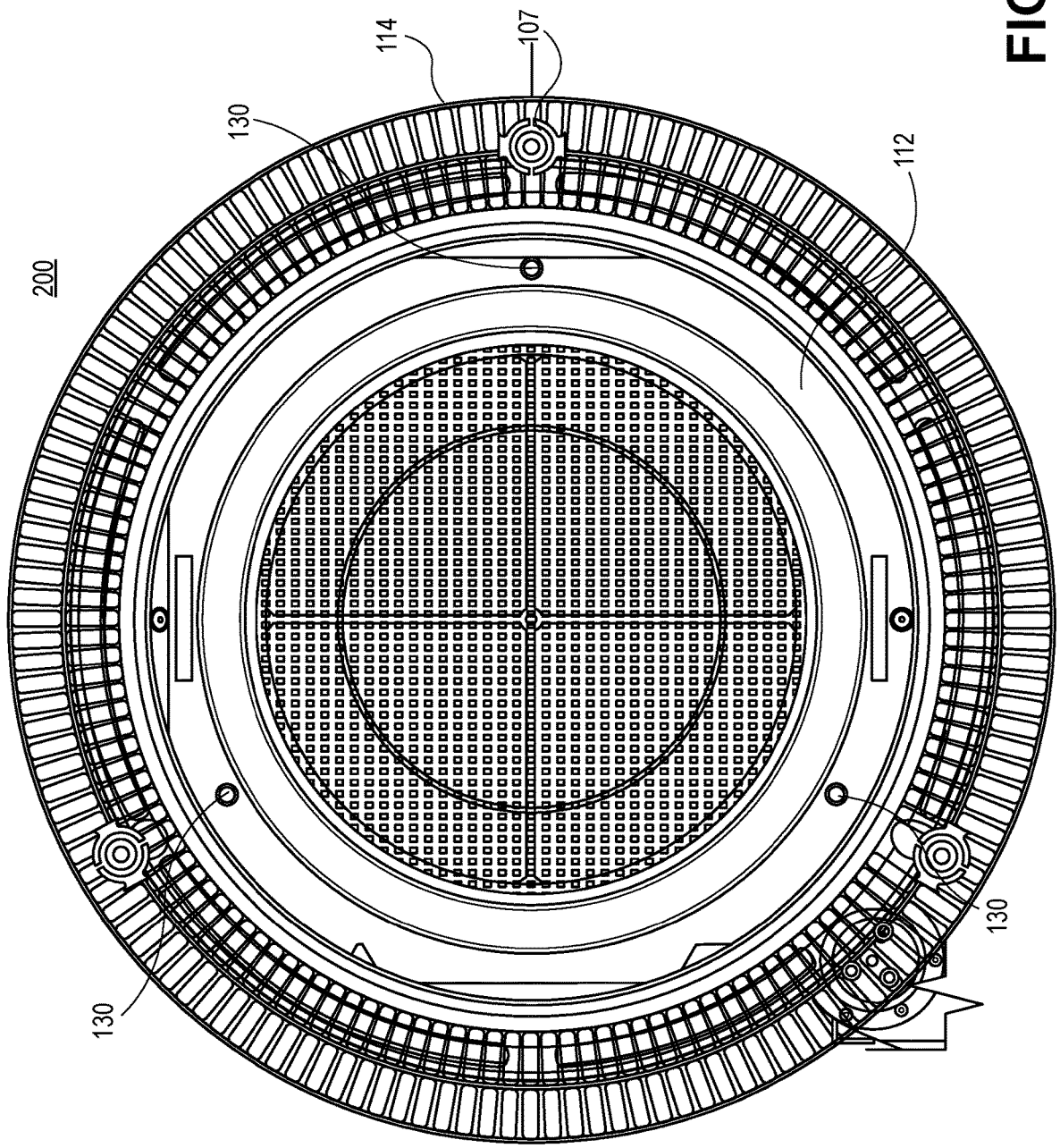
FIGS. 2A-2C illustrate a plan view, a cross-sectional view, and an angled view of various aspects and portions of an electrostatic chuck, in accordance with an embodiment of the present disclosure.
Figure 2B:
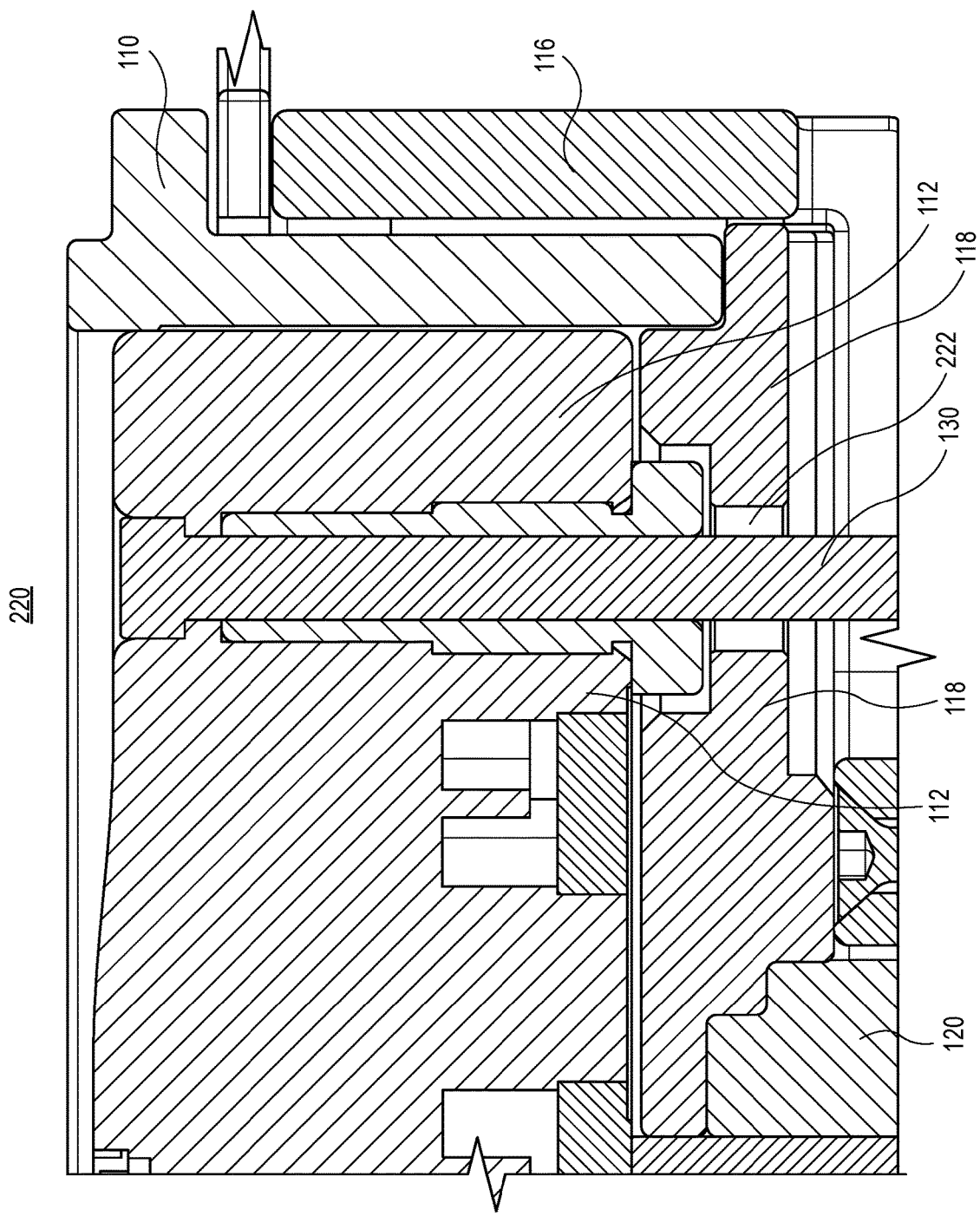
Figure 2C:
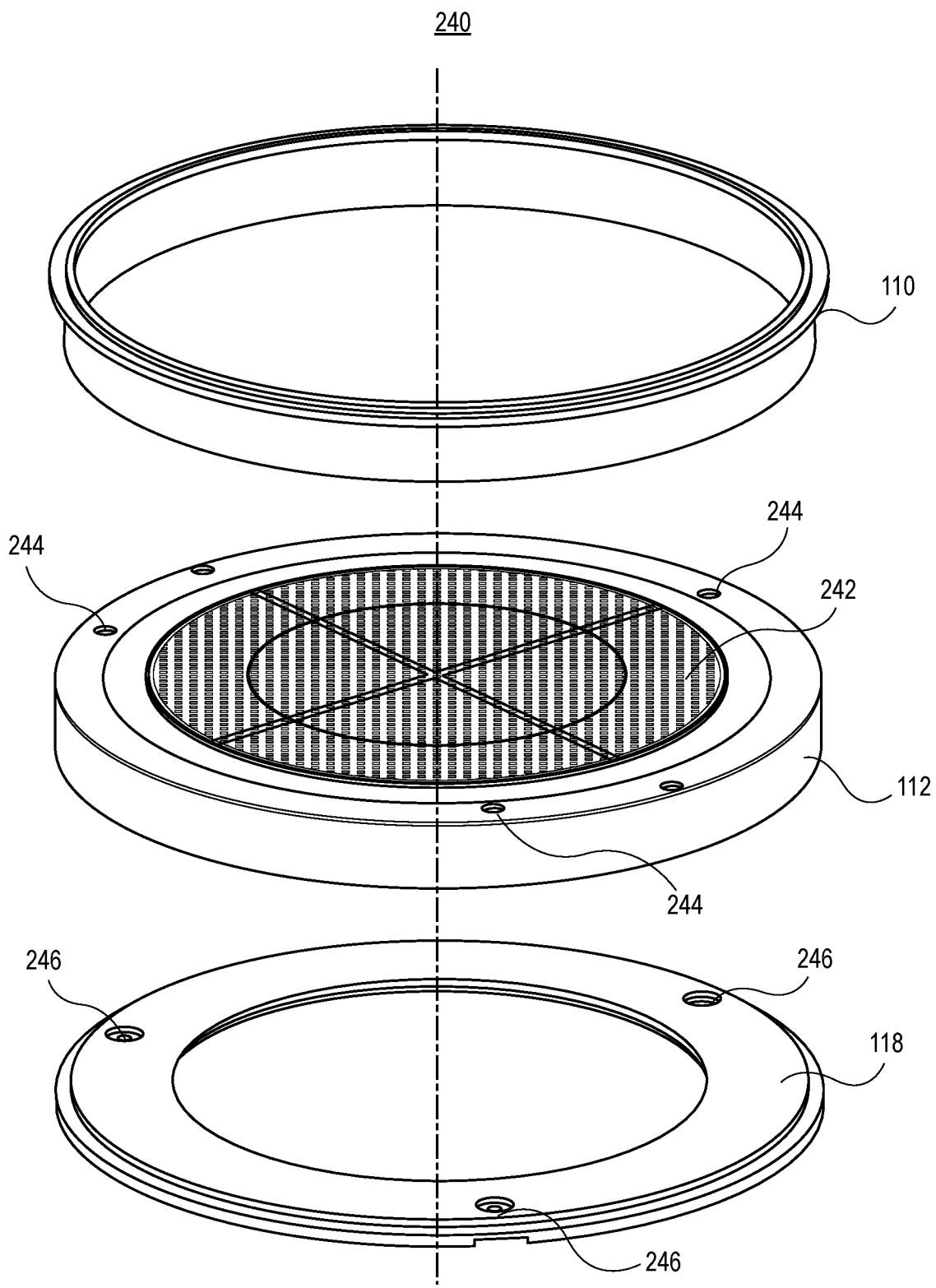

FIGS. 2A, 2B and 2C illustrate a plan view 200, a cross-sectional view 220, and an angled view 240, respectively, of various aspects and portions of an electrostatic chuck, in accordance with an embodiment of the present disclosure. Like numbers from FIG. 1A are as described above in association with FIG. 1A.

Referring to FIGS. 2A-2C, an electrostatic chuck includes a conductive pedestal 112 having a plurality of holes 244 near a circumferential edge thereof. The electrostatic chuck also includes a plurality of lift pins 130 corresponding to ones of the plurality of holes 244. In an embodiment, the conductive pedestal 112 is coated with a ceramic material such as alumina, but inner surfaces of each of the plurality of holes are not coated with the ceramic material.

In an embodiment, the electrostatic chuck further includes an edge insulator ring 110 laterally around the conductive pedestal 112. In an embodiment, the electrostatic chuck further includes a bottom insulator ring 118 beneath the conductive pedestal 112, the bottom insulator ring 118 having a plurality of openings (222 in FIG. 2B, and 246 in FIG. 2C) corresponding to ones of the plurality of lift pins 130.

In an embodiment, the plurality of lift pins 130 is located outside of a perimeter of a processing region 242 of the conductive pedestal 112, and the plurality of lift pins 130 is arranged for contacting a substrate carrier. In an embodiment, the electrostatic chuck further includes a shadow ring or shadow ring assembly positioned over the plurality of lift pins 130, as is described in association with FIG. 1B.

Figure 3A:
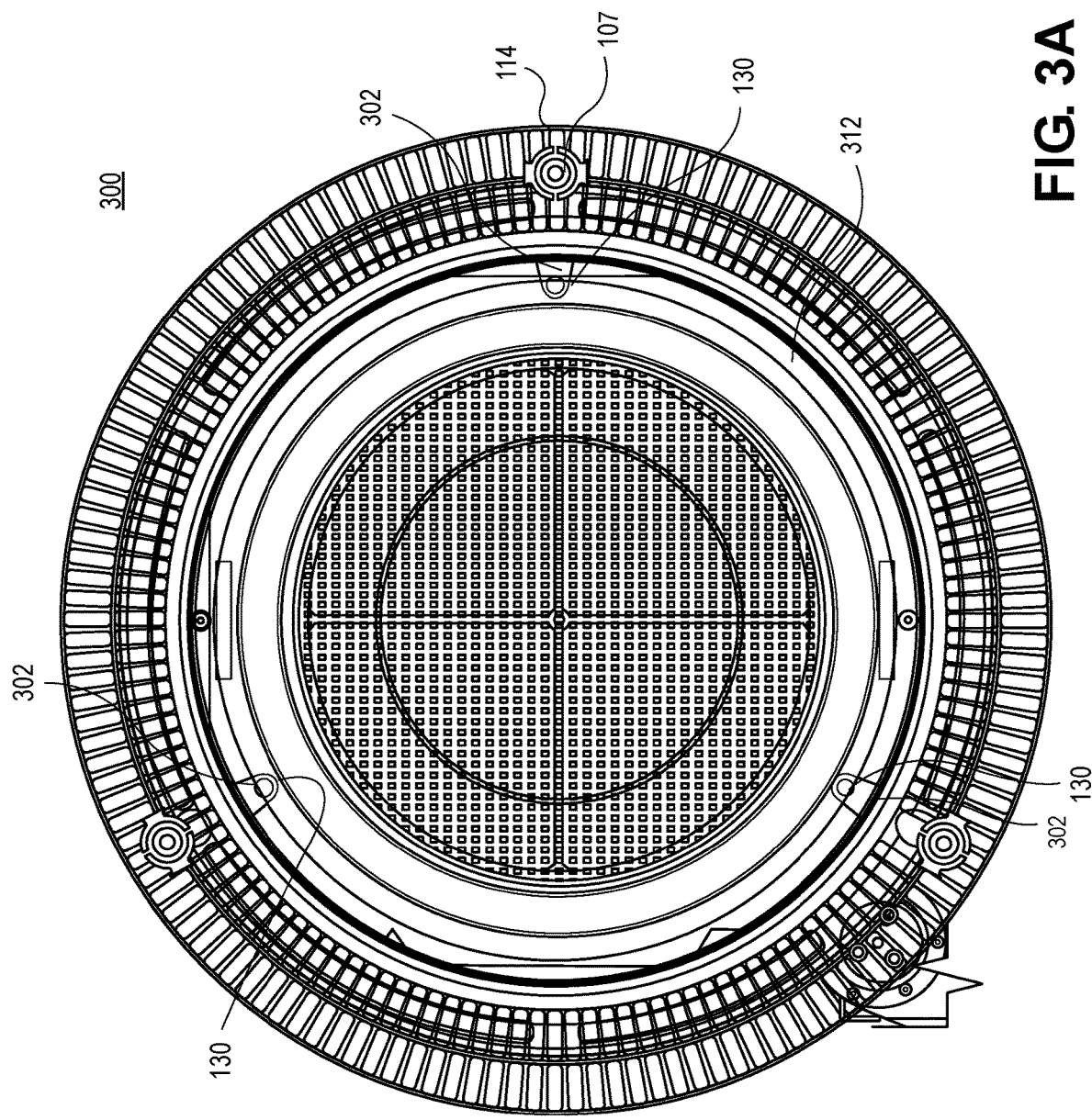
FIGS. 3A-3C illustrate a plan view, a cross-sectional view, and an angled view of various aspects and portions of an electrostatic chuck, in accordance with an embodiment of the present disclosure.
Figure 3B:
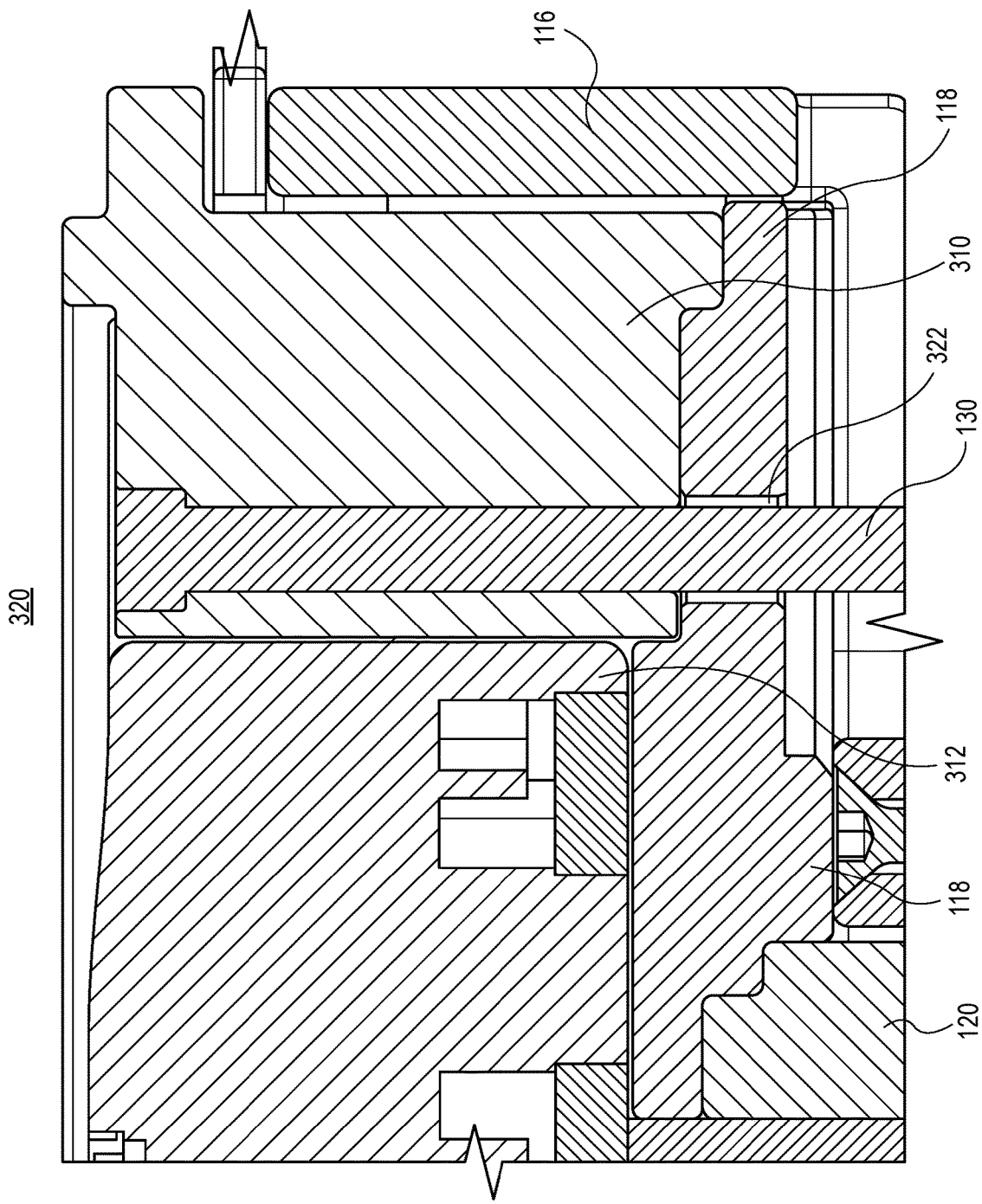
Figure 3C:
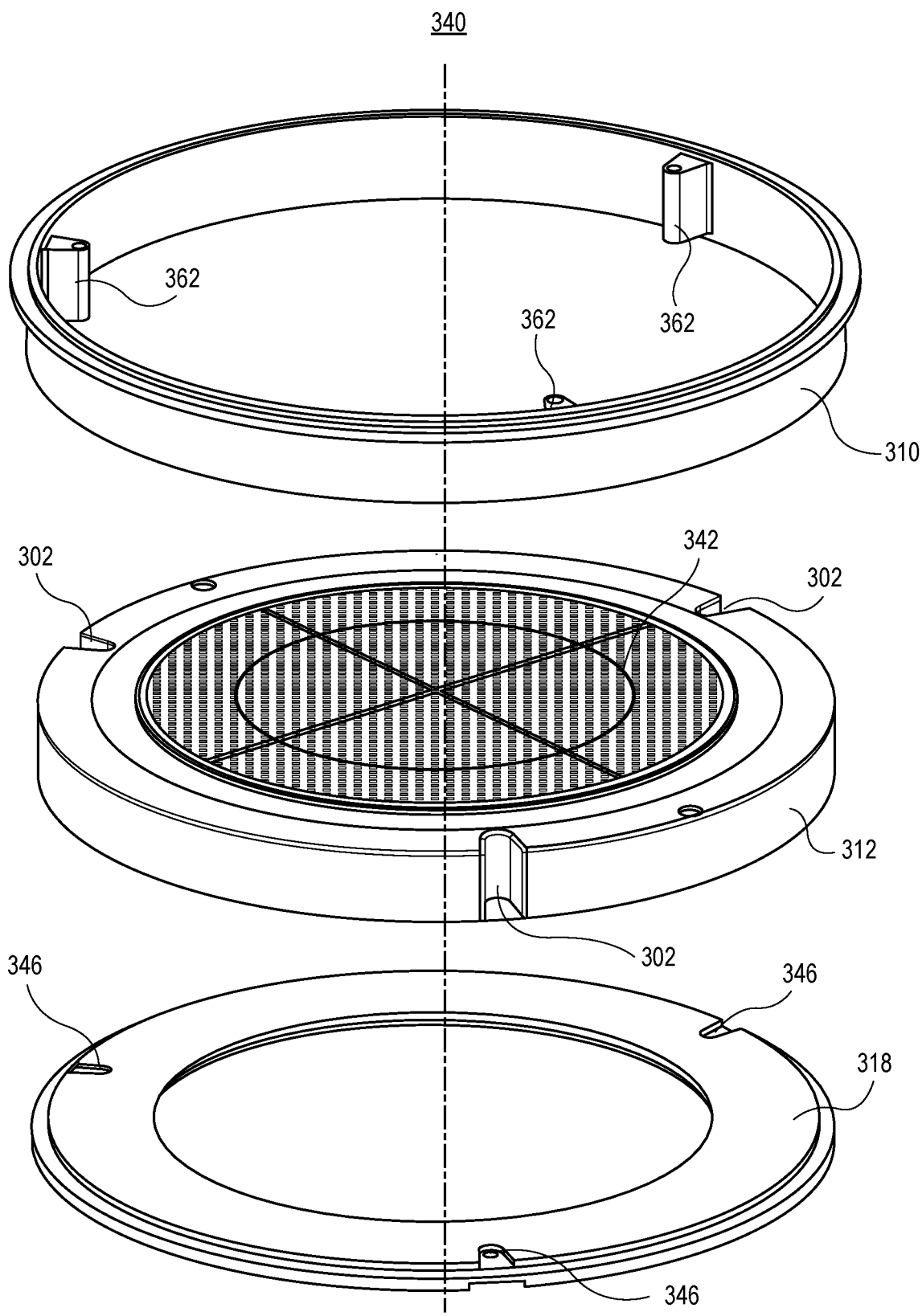

FIGS. 3A, 3B and 3C illustrate a plan view 300, a cross-sectional view 320, and an angled view 340, respectively, of various aspects and portions of an electrostatic chuck, in accordance with another embodiment of the present disclosure. Like numbers from FIG. 1A are as described above in association with FIG. 1A.

Referring to FIGS. 3A-3C, an electrostatic chuck includes a conductive pedestal 312 having a plurality of notches 302 at a circumferential edge thereof. The electrostatic chuck also includes a plurality of lift pins 130 corresponding to ones of the plurality of notches 302. In an embodiment, the conductive pedestal 312 and surfaces of the plurality of notches 302 are coated with a ceramic material. In one such embodiment, wherein the ceramic material is or includes alumina.

In an embodiment, the electrostatic chuck further includes an edge insulator ring 310 laterally around the conductive pedestal 312. The edge insulator ring 310 has a plurality of inner protrusions 362 corresponding to ones of the plurality of notches 302. Each of the plurality of inner protrusions 362 has an opening there through to accommodate corresponding ones of the plurality of lift pins 130.

In an embodiment, the electrostatic chuck further includes a bottom insulator ring 318 beneath the conductive pedestal 312. The bottom insulator ring 312 has a plurality of openings (322 in FIG. 3B, and 346 in FIG. 3C) corresponding to ones of the plurality of lift pins.

In an embodiment, the edge insulator ring 310 and the bottom insulator ring 318 are composed of a ceramic material such as alumina, and the conductive pedestal 312 is composed of aluminum. The conductive pedestal 312 may be electrically coupled to ground and/or a DC voltage.

In an embodiment, the plurality of lift pins 130 is located outside of a perimeter of a processing region 342 of the conductive pedestal 312. In one such embodiment, the plurality of lift pins 130 is arranged for contacting a substrate carrier. In an embodiment, the electrostatic chuck further includes a shadow ring or shadow ring assembly positioned over the plurality of lift pins 130, as is described in association with FIG. 1A.

In an aspect of the present disclosure, a thin substrate (e.g., with a thickness of approximately 100 microns or less) is accommodated in a hybrid laser ablation and plasma etching singulation process. In one such embodiment, the thin substrate is supported on a substrate carrier. For example, FIG. 1B illustrates a plan view of a substrate carrier suitable for supporting a thin wafer during a singulation process, in accordance with an embodiment of the present disclosure.

Figure 1B:
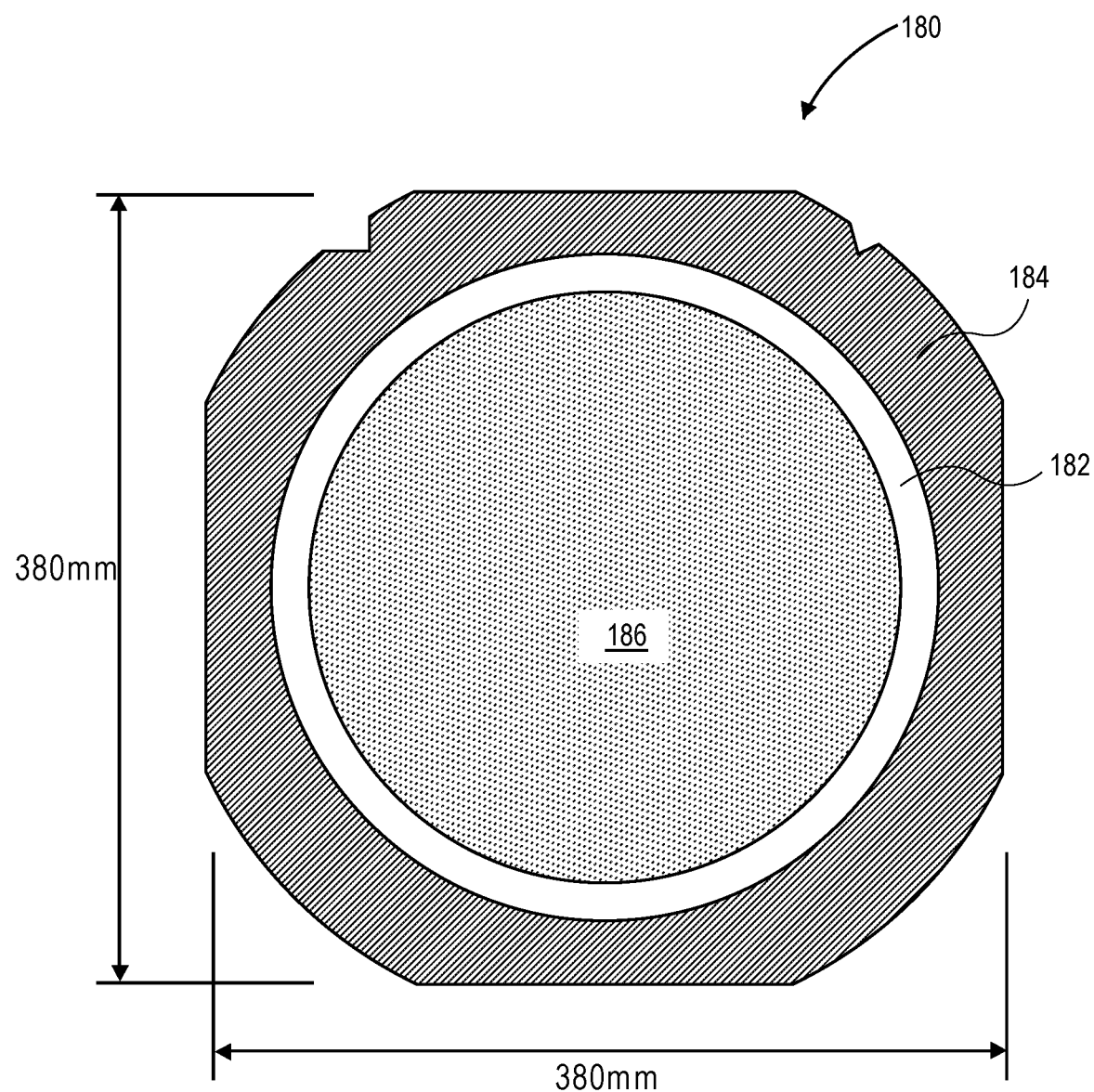
FIG. 1B illustrates a plan view of a substrate carrier suitable for supporting a thin wafer during a singulation process, in accordance with an embodiment of the present disclosure.

Referring to FIG. 1B, a substrate carrier 180 includes a layer of backing tape 182 surrounded by a tape ring or frame 184. A wafer or substrate 186, such as a thin wafer or substrate, is supported by the backing tape 182 of the substrate carrier 180. In one embodiment, the wafer or substrate 186 is attached to the backing tape 182 by a die attach film. In one embodiment, the tape ring or frame 184 is composed of stainless steel. In an embodiment, an electrostatic chuck described in association with FIG. 1A, FIG. 2A-2C or 3A-3C accommodates an assembly such as substrate carrier 180.

In an embodiment, a singulation process can be accommodated in a system sized to receive a substrate carrier such as the substrate carrier 180. In one such embodiment, a system such as system 400 or 500 described below can accommodate a thin wafer frame without impact on the system footprint that is otherwise sized to accommodate a substrate or wafer not supported by a substrate carrier. In one embodiment, system 400 or 500 is sized to accommodate 300 millimeter-in-diameter wafers or substrates. The same system can accommodate a wafer carrier approximately 380 millimeters in width by 380 millimeters in length, as depicted in FIG. 1B.

In an aspect of the present disclosure, a substrate carrier is accommodated in an etch chamber during a singulation process. In an embodiment, the assembly including a thin wafer or substrate on the substrate carrier is subjected to a plasma etch apparatus without affecting (e.g., etching) the film frame (e.g., tape ring or frame 184) and the film (e.g., backing tape 182). Furthermore, aspects of the disclosure address transfer and support a wafer or substrate supported by a combination film and film frame (substrate carrier) during the etch process. In particular, an etch apparatus may be configured to accommodate etching of a thin wafer or substrate supported by a substrate carrier. For example, FIG. 4 illustrates a cross-sectional view of an etch apparatus, in accordance with an embodiment of the present disclosure.

Figure 4:
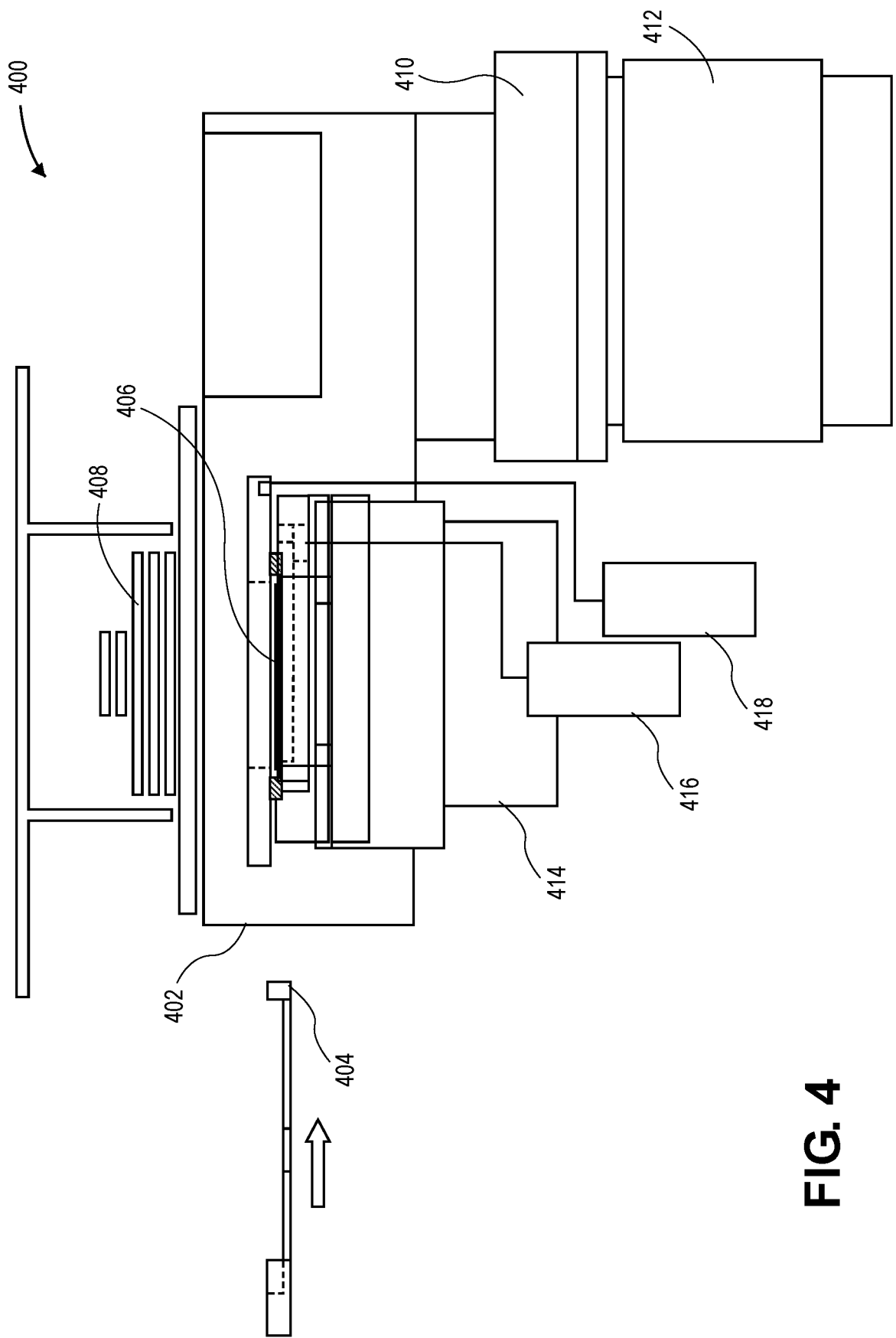
FIG. 4 illustrates a cross-sectional view of a plasma etch apparatus, in accordance with an embodiment of the present disclosure.

Referring to FIG. 4, an etch apparatus 400 includes a chamber 402. An end effector 404 is included for transferring a substrate carrier 406 to and from chamber 402. An inductively coupled plasma (ICP) source 408 is positioned above the chamber 402. The chamber 402 is further equipped with a throttle valve 410 and a turbo molecular pump 412. In an embodiment, the etch apparatus 400 also includes an electrostatic chuck assembly 414, such as an electrostatic chuck described above in association with FIGS. 1A, 2A-2C and 3A-3C. In an embodiment, the etch apparatus 400 also includes a lift pin actuator 416 and/or a shadow mask or ring actuator 1418, as is depicted.

Figure 5:
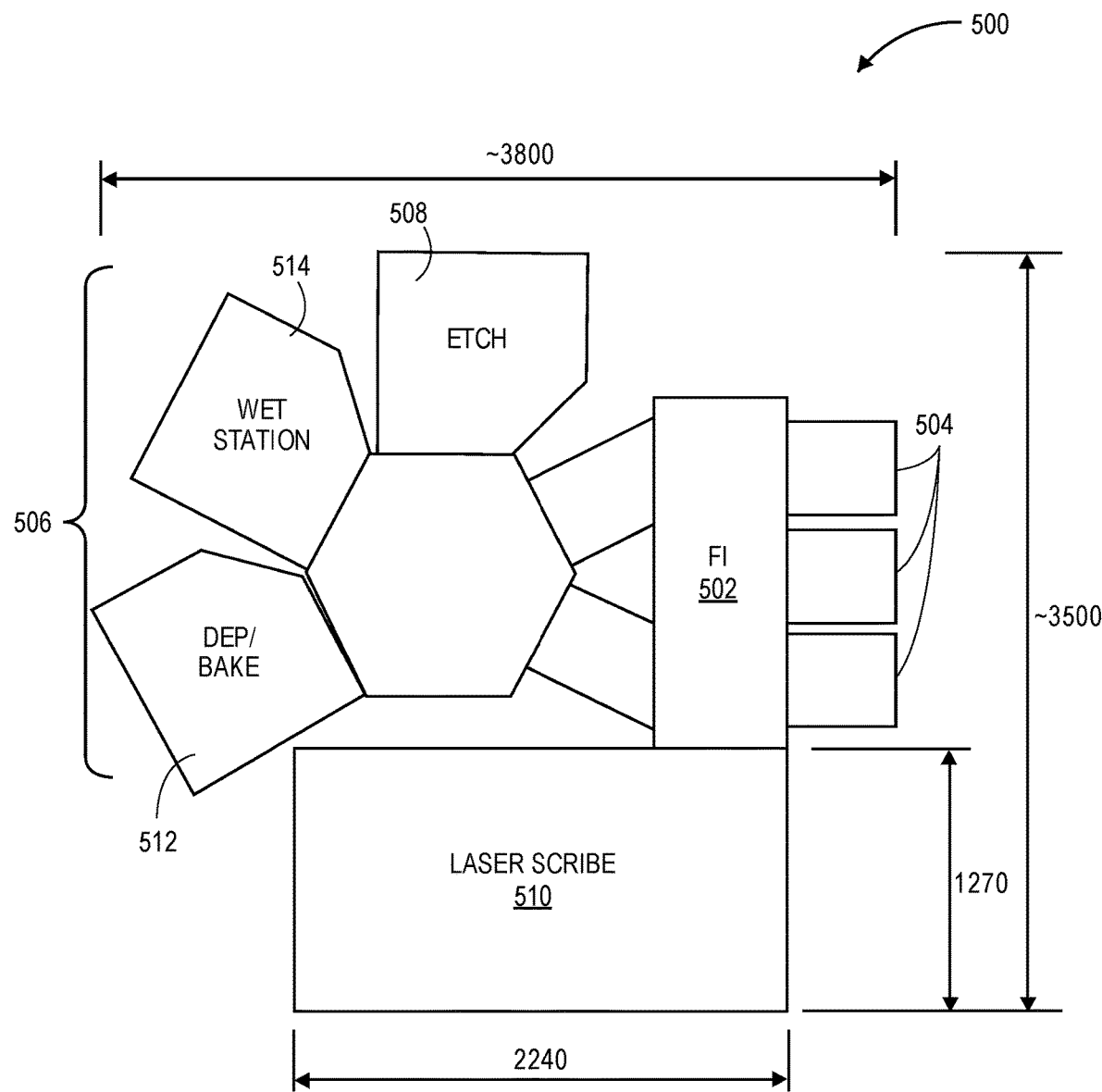
FIG. 5 illustrates a block diagram of a tool layout for laser and plasma dicing of wafers or substrates, in accordance with an embodiment of the present disclosure.

A single process tool may be configured to perform many or all of the operations in a hybrid laser ablation and plasma etch singulation process. For example, FIG. 5 illustrates a block diagram of a tool layout for laser and plasma dicing of wafers or substrates, in accordance with an embodiment of the present disclosure. It is to be appreciated that, in light of the disclosure below, in other embodiments, coat/bake/clean (CBC) processing chambers may instead be included on a separate tool or as separate tools.

Referring to FIG. 5, a process tool 500 includes a factory interface 502 (FI) having a plurality of load locks 504 coupled therewith. A cluster tool 506 is coupled with the factory interface 502. The cluster tool 506 includes one or more plasma etch chambers, such as plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5. In an embodiment, the laser scribe apparatus 510 is configured to perform laser ablation of streets between integrated circuits of a semiconductor wafer, and the plasma etch chamber 508 is configured to etch the semiconductor wafer to singulate the integrated circuits subsequent to the laser ablation.

In an embodiment, the laser scribe apparatus 510 houses a laser assembly configured to provide a femto-second based laser beam. In one such embodiment, the femtosecond-based laser has a wavelength of approximately less than or equal to 530 nanometers with a laser pulse width of approximately less than or equal to 400 femtoseconds. In an embodiment, the laser is suitable for performing a laser ablation portion of a hybrid laser and etch singulation process, such as the laser ablation processes described below. In one embodiment, a moveable stage is also included in laser scribe apparatus 510, the moveable stage configured for moving a wafer or substrate (or a carrier thereof) relative to the laser. In a specific embodiment, the laser is also moveable. The overall footprint of the laser scribe apparatus 510 may be, in one embodiment, approximately 2240 millimeters by approximately 1270 millimeters, as depicted in FIG. 5.

In an embodiment, the one or more plasma etch chambers 508 is configured for etching a wafer or substrate through the gaps in a patterned mask to singulate a plurality of integrated circuits. In one such embodiment, the one or more plasma etch chambers 508 is configured to perform a deep silicon etch process. In a specific embodiment, the one or more plasma etch chambers 508 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in (or is coupled to) the plasma etch chamber 508 to facilitate high silicon etch rates. In an embodiment, more than one etch chamber is included in the cluster tool 506 portion of process tool 500 to enable high manufacturing throughput of the singulation or dicing process.

Plasma etch chamber 508 may include an electrostatic chuck therein. In an embodiment, the electrostatic chuck includes a conductive pedestal having a plurality of notches at a circumferential edge thereof, and a plurality of lift pins corresponding to ones of the plurality of notches, as described above. In one embodiment, the conductive pedestal and surfaces of the plurality of notches of the electrostatic chuck are coated with a ceramic material. In one embodiment, the electrostatic chuck further includes an edge insulator ring (e.g., 310) laterally around the conductive pedestal (e.g., 312), the edge insulator ring having a plurality of inner protrusions (e.g., 362) corresponding to ones of the plurality of notches (e.g., 302), each of the plurality of inner protrusions having an opening there through to accommodate corresponding ones of the plurality of lift pins. In one embodiment, the electrostatic chuck further includes a bottom insulator ring (e.g., 318) beneath the conductive pedestal (e.g., 312), the bottom insulator ring having a plurality of openings (e.g., 346) corresponding to ones of the plurality of lift pins. In one embodiment, the plurality of lift pins of the electrostatic chuck of the plasma etch chamber 508 is located outside of a perimeter of a processing region (e.g., 342) of the conductive pedestal (e.g., 312), the plurality of lift pins arranged for contacting a substrate carrier (e.g., for contacting the tape ring or frame 184 of the substrate carrier assembly 180 described in association with FIG. 1B).

The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either cluster tool 506 or laser scribe apparatus 510, or both.

Cluster tool 506 may include other chambers suitable for performing functions in a method of singulation. For example, in one embodiment, a deposition and/or bake chamber 512 is included. The deposition and/or bake chamber 512 may be configured for mask deposition on or above a device layer of a wafer or substrate prior to laser scribing of the wafer or substrate. Such a mask material may be baked prior to the dicing process, as is described above. Such a mask material may be water soluble, as is also described below.

In an embodiment, referring again to FIG. 5, a wet station 514 is included. The wet station may be suitable for cleaning performing a room temperature or a hot aqueous treatment for removing a water soluble mask, as is described below, subsequent to a laser scribe and plasma etch singulation process of a substrate or wafer, or subsequent to a laser scribe-only singulation process. In an embodiment, although not depicted, a metrology station is also included as a component of process tool 500. The cleaning chamber can include atomized mist and/or megasonics nozzle hardware that adds a physical component to the cleaning process, enhancing the dissolution rate of the mask.

Figure 6A:
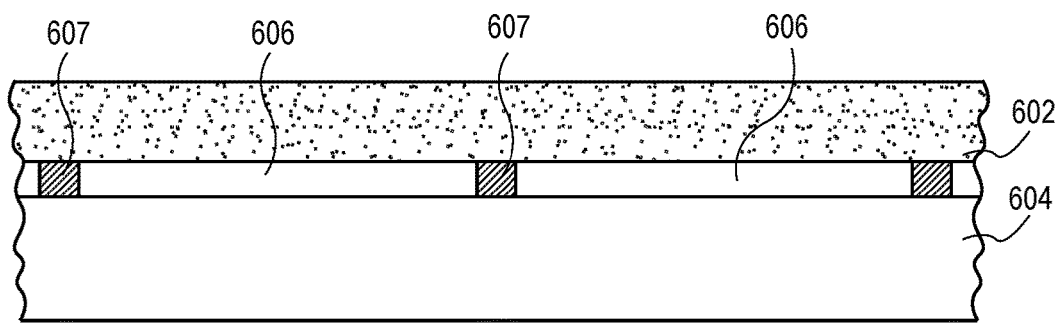
FIGS. 6A-6C illustrate cross-sectional views representing various operations a method of dicing a semiconductor wafer, in accordance with an embodiment of the present disclosure.
Figure 6B:
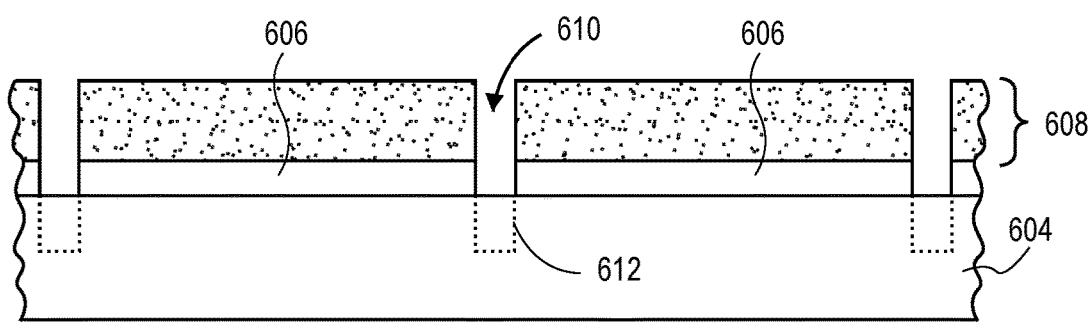
Figure 6C:
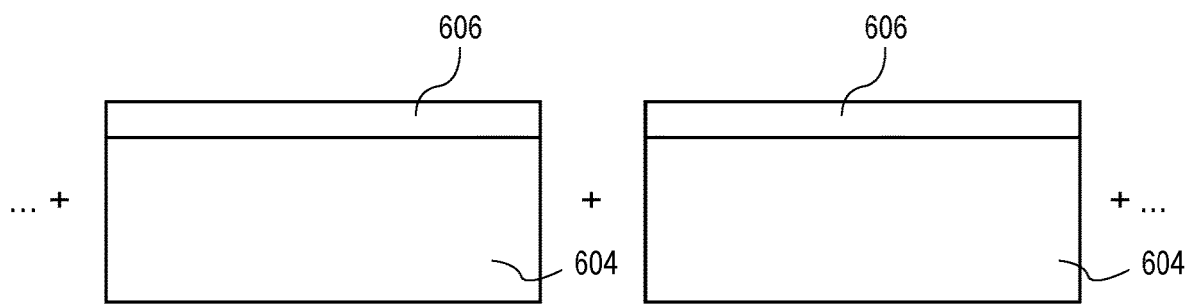

In another aspect, FIGS. 6A-6C illustrate cross-sectional views representing various operations a method of dicing a semiconductor wafer, in accordance with an embodiment of the present disclosure.

Referring to FIG. 6A, a mask 602 is formed above a semiconductor wafer or substrate 604. The mask 602 covers and protects integrated circuits 606 formed on the surface of semiconductor wafer 604. The mask 602 also covers intervening streets 607 formed between each of the integrated circuits 606.

In an embodiment, the semiconductor wafer or substrate 604 is supported by a substrate carrier (such as a substrate carrier described in association with FIG. 1B) during the forming of the mask 602. In an embodiment, forming the mask 602 above the semiconductor wafer 604 includes spin-coating the mask 602 on the semiconductor wafer 604. In a specific embodiment, prior to coating, a plasma or chemical pre-treatment is performed to enable better wettability and coating of the wafer.

In an embodiment, mask 602 is a water soluble mask in that it is readily dissolvable in an aqueous media. For example, in one embodiment, the as deposited water-soluble mask 602 is composed of a material that is soluble in one or more of an alkaline solution, an acidic solution, or in deionized water. In a specific embodiment, the as-deposited water-soluble mask 602 has an etch or removal rate in an aqueous solution approximately in the range of 1-15 microns per minute. In one embodiment, mask 602 is a polyvinyl alcohol (PVA)-based water soluble mask.

In an embodiment, semiconductor wafer or substrate 604 is composed of a material suitable to withstand a fabrication process and upon which semiconductor processing layers may suitably be disposed. For example, in one embodiment, semiconductor wafer or substrate 604 is composed of a group IV-based material such as, but not limited to, crystalline silicon, germanium or silicon/germanium. In a specific embodiment, providing semiconductor wafer 604 includes providing a monocrystalline silicon substrate. In a particular embodiment, the monocrystalline silicon substrate is doped with impurity atoms. In another embodiment, semiconductor wafer or substrate 604 is composed of a III-V material such as, e.g., a III-V material substrate used in the fabrication of light emitting diodes (LEDs).

In an embodiment, semiconductor wafer or substrate 604 has disposed thereon or therein, as a portion of the integrated circuits 606, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 606. Materials making up the streets 607 may be similar to or the same as those materials used to form the integrated circuits 606. For example, streets 607 may be composed of layers of dielectric materials, semiconductor materials, and metallization. In one embodiment, one or more of the streets 607 includes test devices similar to the actual devices of the integrated circuits 606.

In an optional embodiment, the mask 602 is baked prior to laser patterning of the mask. In an embodiment, the mask 602 is baked to increase the etch resistance of the mask 602. In a specific embodiment, the mask 602 is baked at a relatively high temperature approximately in the range of 50 to 130 degrees Celsius. Such higher temperature baking may cause crosslink of the mask 602 so as to significantly increase etch resistance. In one embodiment, baking is performed using a hot plate technique or a heat (light) radiation applied from the wafer front side (e.g., non-tape mounted side in the case of the use of a substrate carrier) or other suitable techniques.

Referring to FIG. 6B, the mask 602 is patterned with a laser scribing process to provide patterned mask 608 with gaps 610, exposing regions of the semiconductor wafer or substrate 604 between the integrated circuits 606. As such, the laser scribing process is used to remove the material of the streets 607 originally formed between the integrated circuits 606. In accordance with an embodiment of the present disclosure, patterning the mask 602 with the laser scribing process further includes forming trenches 612 partially into the regions of the semiconductor wafer 604 between the integrated circuits 606, as is also depicted in FIG. 6B. In an embodiment, the semiconductor wafer or substrate 604 is supported by a substrate carrier (such as a substrate carrier described in association with FIG. 1B) during the laser scribing process.

In an embodiment, the mask 602 is patterned with a Gaussian laser beam, however, non-Gaussian beams may also be used. Additionally, the beam may be stationary or rotating. In an embodiment, a femtosecond-based laser is used as a source for a laser scribing process. For example, in an embodiment, a laser with a wavelength in the visible spectrum plus the ultra-violet (UV) and infra-red (IR) ranges (totaling a broadband optical spectrum) is used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 602, the streets 607 and, possibly, a portion of the semiconductor wafer or substrate 604.

It is to be appreciated that by using a laser beam profile with contributions from the femtosecond range, heat damage issues are mitigated or eliminated versus longer pulse widths (e.g., nanosecond processing). The elimination or mitigation of damage during laser scribing may be due to a lack of low energy recoupling or thermal equilibrium. It is also to be appreciated that laser parameter selection, such as beam profile, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 7 illustrates a cross-sectional view of a stack of materials that may be used in a street region of a semiconductor wafer or substrate, in accordance with an embodiment of the present disclosure.

Figure 7:
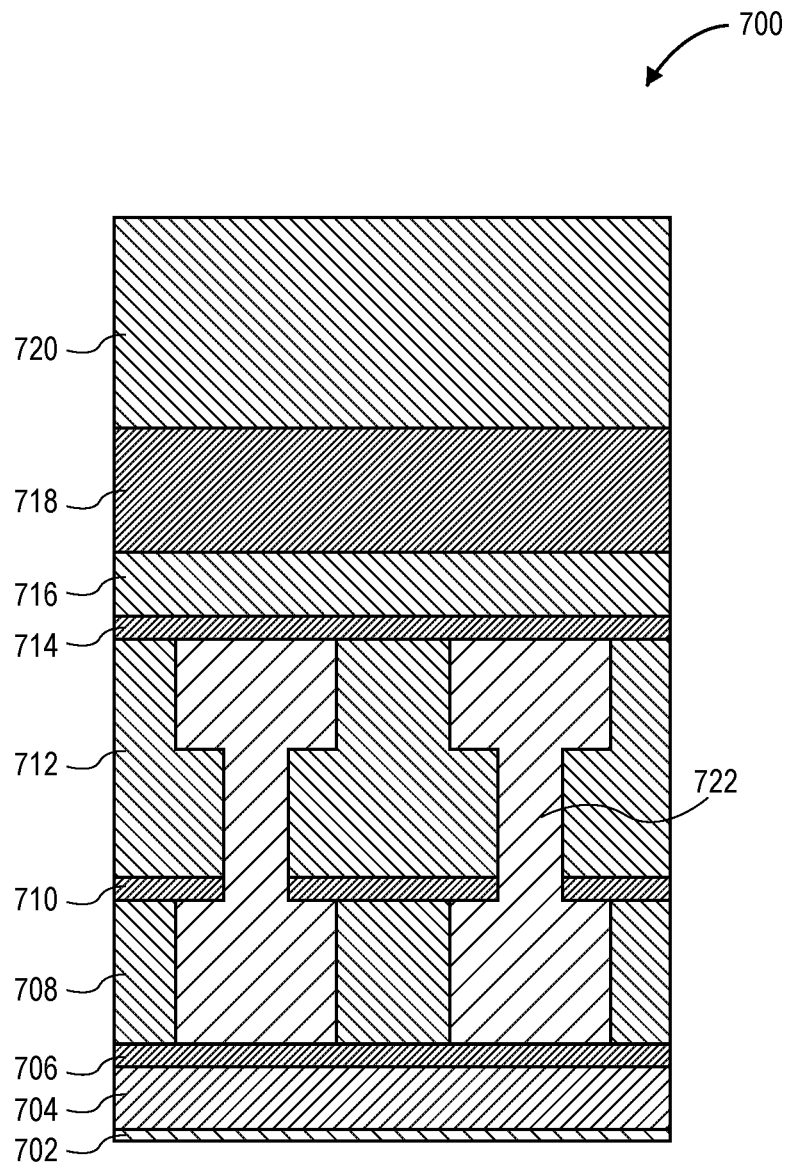
FIG. 7 illustrates a cross-sectional view of a stack of materials that may be used in a street region of a semiconductor wafer or substrate, in accordance with an embodiment of the present disclosure.

Referring to FIG. 7, a street region 700 includes the top portion 702 of a silicon substrate, a first silicon dioxide layer 704, a first etch stop layer 706, a first low K dielectric layer 708 (e.g., having a dielectric constant of less than the dielectric constant of 4.0 for silicon dioxide), a second etch stop layer 710, a second low K dielectric layer 712, a third etch stop layer 714, an undoped silica glass (USG) layer 716, a second silicon dioxide layer 718, and a scribing and/or etch mask 720 (such as a mask described above in association with mask 602). Copper metallization 722 is disposed between the first and third etch stop layers 706 and 714 and through the second etch stop layer 710. In a specific embodiment, the first, second and third etch stop layers 706, 710 and 714 are composed of silicon nitride, while low K dielectric layers 708 and 712 are composed of a carbon-doped silicon oxide material.

Under conventional laser irradiation (such as nanosecond-based irradiation), the materials of street 700 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based irradiation. In an embodiment, a femto-second based laser scribing process is used to pattern a layer of silicon dioxide, a layer of low K material, and a layer of copper by ablating the layer of silicon dioxide prior to ablating the layer of low K material and the layer of copper.

In case that the laser beam it is a femtosecond-based laser beam, in an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth.

In an optional embodiment, subsequent to the laser scribing process and prior to a plasma etching singulation process, an intermediate post mask-opening cleaning operation is performed. In an embodiment, the post mask-opening cleaning operation is a plasma-based cleaning process. In an example, as described below, the plasma-based cleaning process is non-reactive to the trenches 612 of the substrate 604 exposed by the gaps 610.

In accordance with one embodiment, the plasma-based cleaning process is non-reactive to exposed regions of the substrate 604 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks such as mask 602. In another such embodiment, separate mask condensation (densification of the surface layer) and scribed trench cleaning operations are used, e.g., an Ar or non-reactive gas (or the mix) highly-biased plasma treatment for mask condensation is first performed, and then an Ar+SF$_6$ plasma cleaning of a laser scribed trench is performed. This embodiment may be suitable for cases where Ar-cleaning is not sufficient for trench cleaning due to too thick of a mask material. In this case, metal salts of the mask may provide etch resistance during a plasma cleaning operation including SF$_6$.

Referring to FIG. 6C, the semiconductor wafer 604 is etched through the gaps 610 in the patterned mask 608 to singulate the integrated circuits 606. In accordance with an embodiment of the present disclosure, etching the semiconductor wafer 604 includes ultimately etching entirely through semiconductor wafer 604, as depicted in FIG. 6C, by etching the trenches 612 initially formed with the laser scribing process. The patterned mask 608 protects the integrated circuits during the plasma etching.

In an embodiment, the semiconductor wafer or substrate 602 is supported by a substrate carrier (such as a substrate carrier described in association with FIG. 1B) during the plasma etching process. In one such embodiment, the substrate carrier is supported by an electrostatic chuck having a conductive pedestal having a plurality of notches at a circumferential edge thereof, as described above in association with FIGS. 3A-3C. In one such embodiment, the conductive pedestal and surfaces of the plurality of notches are coated with a ceramic material, and the ceramic material prevents current from leaking from the electrostatic chuck during the etching.

In an embodiment, patterning the mask 602 with the laser scribing process involves forming trenches in the regions of the semiconductor wafer between the integrated circuits, and plasma etching the semiconductor wafer involves extending the trenches to form corresponding trench extensions. In one such embodiment, each of the trenches has a width, and each of the corresponding trench extensions has the width.

In an embodiment, etching the semiconductor wafer 604 includes using a plasma etching process. In one embodiment, a through-silicon via type etch process is used. For example, in a specific embodiment, the etch rate of the material of semiconductor wafer 604 is greater than 10 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 604 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as SF$_6$, C$_4$F$_8$, CHF$_3$, XeF$_2$, or any other reactant gas capable of etching silicon at a relatively fast etch rate. In another embodiment, the plasma etching operation described in association with FIG. 6C employs a conventional Bosch-type dep/etch/dep process to etch through the substrate 604. Generally, a Bosch-type process consists of three sub-operations: deposition, a directional bombardment etch, and isotropic chemical etch which is run through many iterations (cycles) until silicon is etched through.

As mentioned above, in an embodiment, the semiconductor wafer or substrate 602 is supported by a substrate carrier (such as a substrate carrier described in association with FIG. 1B) during the plasma etching process, and the substrate carrier is supported by an electrostatic chuck having a conductive pedestal having a plurality of notches at a circumferential edge thereof. In a particular such embodiment, subsequent to the etching, the substrate carrier is removed from the conductive pedestal using a plurality of lift pins corresponding to ones of the plurality of notches of the conductive pedestal.

In an embodiment, following the singulation process, the patterned mask 608 is removed. In an embodiment, the patterned mask 608 is a water soluble patterned mask. In an embodiment, the patterned mask 608 is removed using an aqueous solution. In one such embodiment, the patterned mask 608 is removed by a hot aqueous treatment, such as a hot water treatment. In a specific embodiment, the patterned mask 608 is removed in a hot water treatment at a temperature approximately in the range of 40-100 degrees Celsius. In a particular embodiment, the patterned mask 608 is removed in a hot water treatment at a temperature approximately in the range of 80-90 degrees Celsius. It is to be appreciated that the hotter the temperature of the water, the less time may be needed for the hot water treatment. In accordance with an embodiment of the present disclosure, a plasma cleaning process can also be performed after etching to aid in the removal of the patterned mask 608.

It is to be appreciated that other circumstances may benefit from a lower water treatment temperature. For example, in the case that a wafer for dicing is supported on a dicing tape that may be impacted by a higher temperature water treatment (e.g., through loss of adhesion), a relatively lower water treatment temperature may be employed, albeit for a longer duration that a relatively higher water treatment temperature. In one such embodiment, the water treatment is between room temperature (i.e., the water is un-heated), but below a temperature of approximately 40 degrees Celsius. In a specific such embodiment, the patterned mask 608 is removed in a warm water treatment at a temperature approximately in the range of 35-40 degrees Celsius.

Referring again to FIGS. 6A-6C, wafer dicing may be preformed by initial ablation to ablate through a mask, through wafer streets (including metallization), and partially into a silicon substrate. Die singulation may then be completed by subsequent through-silicon deep plasma etching. A specific example of a materials stack for dicing is described below in association with FIGS. 8A-8D, in accordance with an embodiment of the present disclosure.

Figure 8A:
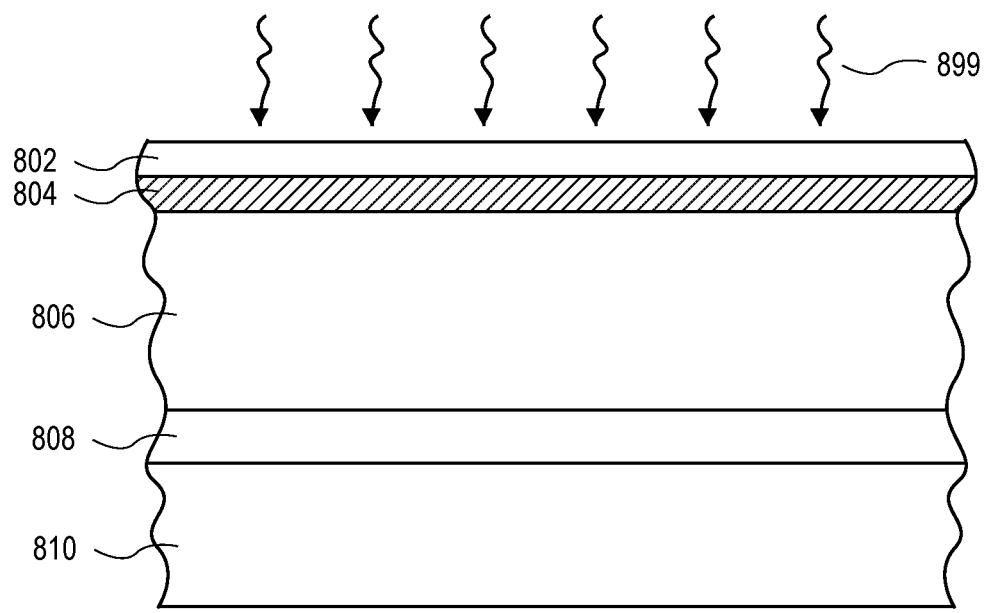
FIGS. 8A-8D illustrate cross-sectional views of various operations in a method of dicing a semiconductor wafer, in accordance with an embodiment of the present disclosure.

Referring to FIG. 8A, a materials stack for hybrid laser ablation and plasma etch dicing includes a mask 802, a device layer 804, and a substrate 806. The mask layer 802, device layer 804, and substrate 806 are disposed above a die attach film 808 which is affixed to a backing tape 810. In other embodiments, direct coupling to a standard dicing tape is used. In an embodiment, the mask 802 is one such as described above in association with mask 602. The device layer 804 includes an inorganic dielectric layer (such as silicon dioxide) disposed above one or more metal layers (such as copper layers) and one or more low K dielectric layers (such as carbon-doped oxide layers). The device layer 804 also includes streets arranged between integrated circuits, the streets including the same or similar layers to the integrated circuits. The substrate 806 is a bulk single-crystalline silicon substrate. In an embodiment, the mask 802 is fabricated using a thermal treatment or bake 899, such as described above. In an embodiment, the mask 802 is a water mask.

In an embodiment, the bulk single-crystalline silicon substrate 806 is thinned from the backside prior to being affixed to the die attach film 808. The thinning may be performed by a backside grind process. In one embodiment, the bulk single-crystalline silicon substrate 806 is thinned to a thickness approximately in the range of 30-200 microns. It is important to note that, in an embodiment, the thinning is performed prior to a laser ablation and plasma etch dicing process. In an embodiment, the mask 802 has a thickness approximately in the range of 3-100 microns and the device layer 804 has a thickness approximately in the range of 2-20 microns. In an embodiment, the die attach film 808 (or any suitable substitute capable of bonding a thinned or thin wafer or substrate to the backing tape 810, such as dicing tapes consisting of an upper adhesive layer and a base film) has a thickness approximately in the range of 10-200 microns.

Figure 8B:
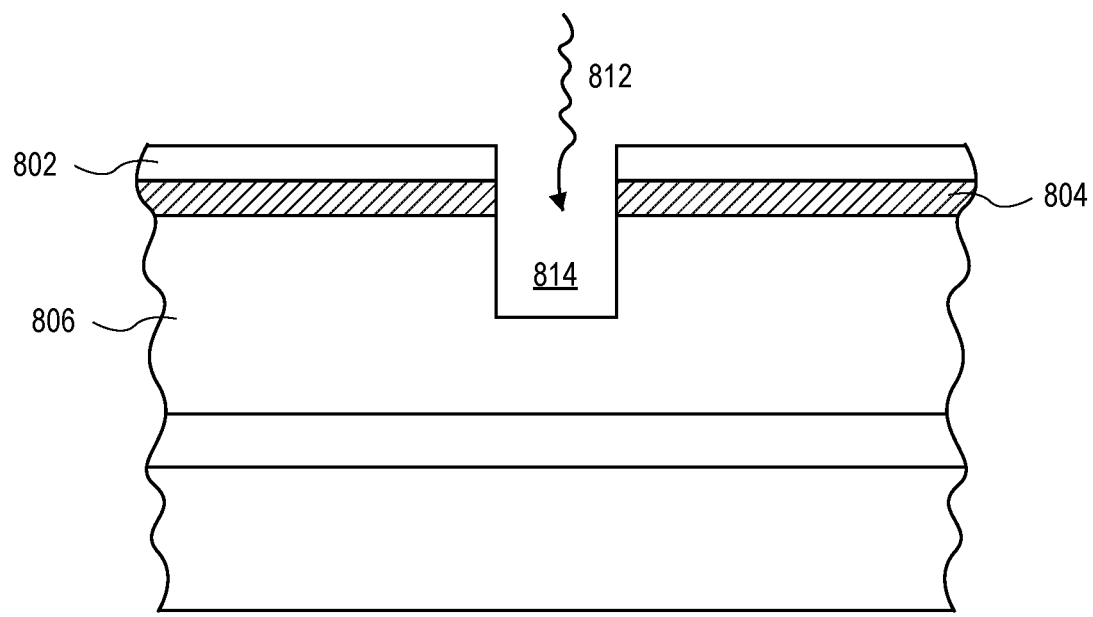

Referring to FIG. 8B, the mask 802, the device layer 804 and a portion of the substrate 806 are patterned with a laser scribing process 812 to form trenches 814 in the substrate 806.

Figure 8C:
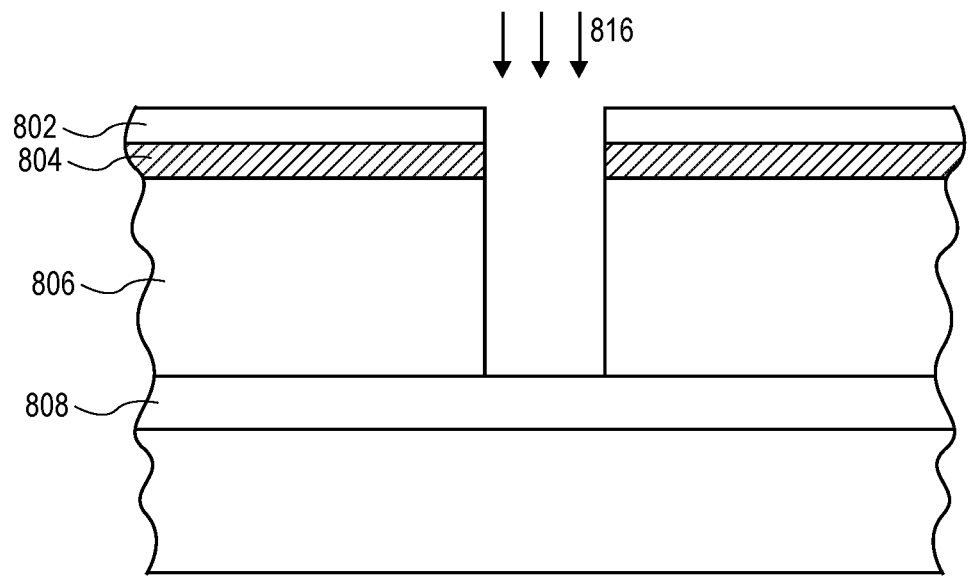

Referring to FIG. 8C, a through-silicon deep plasma etch process 816 is used to extend the trench 814 down to the die attach film 808, exposing the top portion of the die attach film 808 and singulating the silicon substrate 806. The device layer 804 is protected by the mask 802 during the through-silicon deep plasma etch process 816.

Figure 8D:
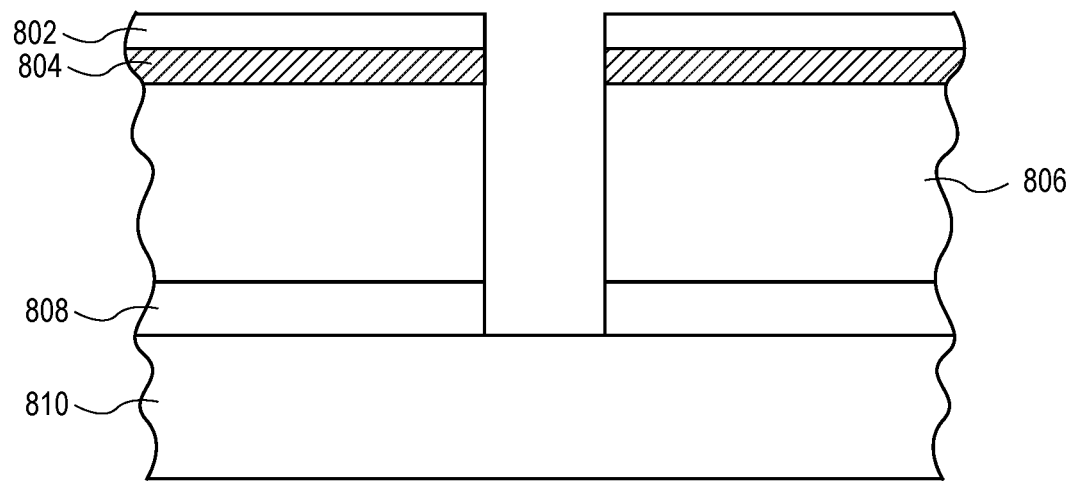

Referring to FIG. 8D, the singulation process may further include patterning the die attach film 808, exposing the top portion of the backing tape 810 and singulating the die attach film 808. In an embodiment, the die attach film is singulated by a laser process or by an etch process. Further embodiments may include subsequently removing the singulated portions of substrate 806 (e.g., as individual integrated circuits) from the backing tape 810. In one embodiment, the singulated die attach film 808 is retained on the back sides of the singulated portions of substrate 806. In an alternative embodiment, in the case that substrate 806 is thinner than approximately 50 microns, the laser scribing process 812 is used to completely singulate substrate 806 without the use of an additional plasma process. Embodiments may further include removing the mask 802 from the device layer 804. Removal of the mask 802 can be as described above for removal of the patterned mask 608.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process tool 500 described in association with FIG. 5 or with etch chamber 400 described in association with FIG. 4. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
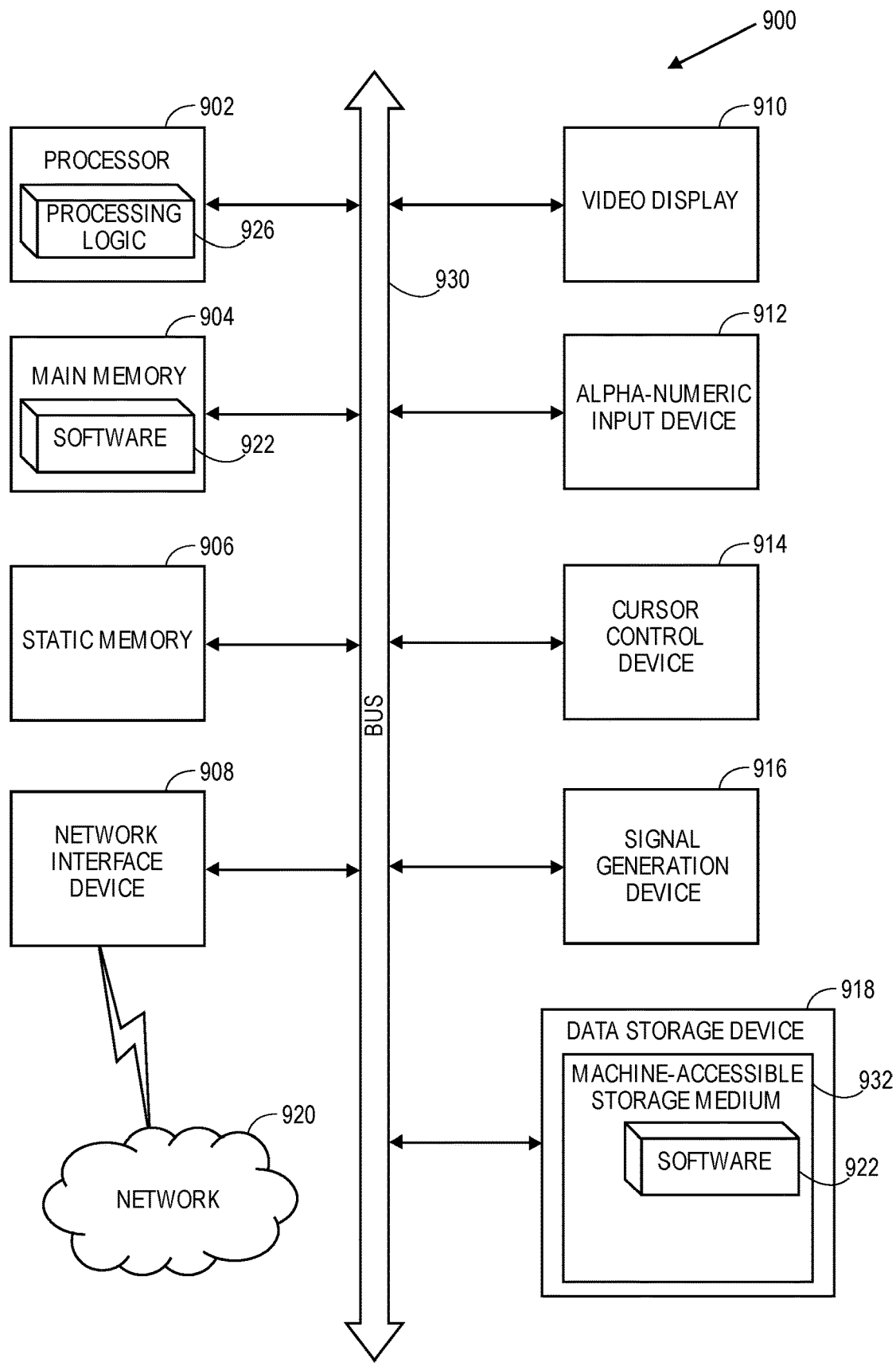
FIG. 9 illustrates a block diagram of an exemplary computer system, in accordance with an embodiment of the present disclosure.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of dicing a semiconductor wafer having a plurality of integrated circuits, such as one or more of the methods described herein.

Thus, hybrid wafer dicing approaches using a laser scribing process and plasma etch process implementing an electrostatic chuck with reduced current leakage have been disclosed.

What is claimed is:

1. An etch apparatus, comprising
a chamber;
a plasma source within or coupled to the chamber; and
an electrostatic chuck within the chamber, the electrostatic chuck comprising: a conductive pedestal having a plurality of notches at a circumferential edge thereof;
a plurality of lift pins corresponding to ones of the plurality of notches; and
an edge insulator ring laterally around the conductive pedestal, the edge insulator ring having a plurality of inner protrusions corresponding to ones of the plurality of notches, each of the plurality of inner protrusions having an opening there through to accommodate corresponding ones of the plurality of lift pins.

2. The etch apparatus of claim 1, wherein the conductive pedestal and surfaces of the plurality of notches are coated with a ceramic material.

3. The etch apparatus of claim 2, wherein the ceramic material comprises alumina.

4. The etch apparatus of claim 1, the electrostatic chuck further comprising:
a bottom insulator ring beneath the conductive pedestal, the bottom insulator ring having a plurality of openings corresponding to ones of the plurality of lift pins.

5. The etch apparatus of claim 1, wherein the plurality of lift pins is located outside of a perimeter of a processing region of the conductive pedestal, the plurality of lift pins arranged for contacting a substrate carrier.

6. The etch apparatus of claim 1, the electrostatic chuck further comprising: a shadow ring positioned over the plurality of lift pins.

7. A method of dicing a semiconductor wafer comprising a plurality of integrated circuits, the method comprising:
forming a mask above the semiconductor wafer, the mask comprising a layer covering and protecting the integrated circuits, and the semiconductor wafer supported by a substrate carrier;
patterning the mask with a laser scribing process to provide a patterned mask with gaps, exposing regions of the semiconductor wafer between the integrated circuits; and
etching the semiconductor wafer through the gaps in the patterned mask to singulate the integrated circuits while the semiconductor wafer is supported by the substrate carrier, and the substrate carrier is supported by an electrostatic chuck comprising a conductive pedestal having a plurality of notches at a circumferential edge thereof, and an edge insulator ring laterally around the conductive pedestal, the edge insulator ring having a plurality of inner protrusions corresponding to ones of the plurality of notches, each of the plurality of inner protrusions having an opening there through to accommodate corresponding ones of a plurality of lift pins.

8. The method of claim 7, wherein the conductive pedestal and surfaces of the plurality of notches are coated with a ceramic material, and wherein the ceramic material prevents current from leaking from the electrostatic chuck during the etching.

9. The method of claim 7, further comprising:
subsequent to the etching, removing the substrate carrier from the conductive pedestal using the plurality of lift pins corresponding to ones of the plurality of notches of the conductive pedestal.

10. A system for dicing a semiconductor wafer comprising a plurality of integrated circuits, the system comprising:
a factory interface;
a laser scribe apparatus coupled with the factory interface and comprising a laser; and
an etch apparatus coupled with the factory interface, the etch apparatus comprising a chamber, a plasma source within or coupled to the chamber, and an electrostatic chuck within the chamber, the electrostatic chuck comprising a conductive pedestal having a plurality of notches at a circumferential edge thereof, and a plurality of lift pins corresponding to ones of the plurality of notches, wherein the electrostatic chuck of the etch apparatus further comprises an edge insulator ring laterally around the conductive pedestal, the edge insulator ring having a plurality of inner protrusions corresponding to ones of the plurality of notches, each of the plurality of inner protrusions having an opening there through to accommodate corresponding ones of the plurality of lift pins.

11. The system of claim 10, wherein the laser scribe apparatus comprises a femtosecond-based laser.

12. The system of claim 11, wherein the femtosecond-based laser has a wavelength of approximately less than or equal to 530 nanometers with a laser pulse width of approximately less than or equal to 400 femtoseconds.

13. The system of claim 10, wherein the laser scribe apparatus is configured to perform laser ablation of streets between integrated circuits of a semiconductor wafer, and wherein the etch apparatus is configured to etch the semiconductor wafer to singulate the integrated circuits subsequent to the laser ablation.

14. The system of claim 10, wherein the etch apparatus is housed on a cluster tool coupled with the factory interface, the cluster tool further comprising:

a deposition chamber configured to form a mask layer above the integrated circuits of the semiconductor wafer.

15. The system of claim 10, wherein the etch apparatus is housed on a cluster tool coupled with the factory interface, the cluster tool further comprising:
a wet/dry station configured to clean the semiconductor wafer subsequent to the laser ablation or the etching.

16. The system of claim 10, wherein the conductive pedestal and surfaces of the plurality of notches of the electrostatic chuck of the etch apparatus are coated with a ceramic material.

17. The system of claim 10, wherein the electrostatic chuck of the etch apparatus further comprises a bottom insulator ring beneath the conductive pedestal, the bottom insulator ring having a plurality of openings corresponding to ones of the plurality of lift pins.

18. The system of claim 10, wherein the plurality of lift pins of the electrostatic chuck of the etch apparatus is located outside of a perimeter of a processing region of the conductive pedestal, the plurality of lift pins arranged for contacting a substrate carrier.

19. An etch apparatus, comprising
a chamber;
a plasma source within or coupled to the chamber; and
an electrostatic chuck within the chamber, the electrostatic chuck comprising: a conductive pedestal having a plurality of notches at a circumferential edge thereof;
a plurality of lift pins corresponding to ones of the plurality of notches; and
a bottom insulator ring beneath the conductive pedestal, the bottom insulator ring having a plurality of openings corresponding to ones of the plurality of lift pins.

20. A system for dicing a semiconductor wafer comprising a plurality of integrated circuits, the system comprising:
a factory interface;
a laser scribe apparatus coupled with the factory interface and comprising a laser; and
an etch apparatus coupled with the factory interface, the etch apparatus comprising a chamber, a plasma source within or coupled to the chamber, and an electrostatic chuck within the chamber, the electrostatic chuck comprising a conductive pedestal having a plurality of notches at a circumferential edge thereof, and a plurality of lift pins corresponding to ones of the plurality of notches, wherein the electrostatic chuck of the etch apparatus further comprises a bottom insulator ring beneath the conductive pedestal, the bottom insulator ring having a plurality of openings corresponding to ones of the plurality of lift pins.

* * * * *